(12) United States Patent
Yokosuka et al.

(10) Patent No.: US 9,472,376 B2
(45) Date of Patent: Oct. 18, 2016

(54) SCANNING ELECTRON MICROSCOPE

(71) Applicant: HITACHI HIGH-TECHNOLOGIES CORPORATION, Tokyo (JP)

(72) Inventors: Toshiyuki Yokosuka, Tokyo (JP); Chahn Lee, Tokyo (JP); Hideyuki Kazumi, Tokyo (JP); Hiroshi Makino, Tokyo (JP); Yuzuru Mizuhara, Tokyo (JP); Miki Isawa, Tokyo (JP); Michio Hatano, Tokyo (JP); Yoshinori Momonoi, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/379,715

(22) PCT Filed: Feb. 18, 2013

(86) PCT No.: PCT/JP2013/053790
§ 371 (c)(1),
(2) Date: Aug. 19, 2014

(87) PCT Pub. No.: WO2013/145924
PCT Pub. Date: Oct. 3, 2013

(65) Prior Publication Data
US 2015/0008322 A1    Jan. 8, 2015

(30) Foreign Application Priority Data
Mar. 28, 2012 (JP) ................ 2012-072710

(51) Int. Cl.
*H01J 37/28* (2006.01)
*G01B 15/00* (2006.01)
*G01B 15/04* (2006.01)

(52) U.S. Cl.
CPC .............. *H01J 37/28* (2013.01); *G01B 15/00* (2013.01); *G01B 15/04* (2013.01);
(Continued)

(58) Field of Classification Search
CPC .............. H01J 37/28; H01J 2237/281; H01J 2237/2815; H01J 2237/2817; H01J 2237/24495; H01J 2237/0492
See application file for complete search history.

(56) References Cited

U.S. PATENT DOCUMENTS 4,327,292 A * 4/1982 Wang et al. ................ 250/491.1
4,983,540 A * 1/1991 Yamaguchi et al. ............ 438/10
(Continued)

FOREIGN PATENT DOCUMENTS

JP    01-115042 A    5/1989
JP    05-029424 A    2/1993
(Continued)

OTHER PUBLICATIONS

International Search Report issued in International Application No. PCT/JP2013/053790 dated Mar. 26, 2013, with English translation.

*Primary Examiner* — Nicole Ippolito
*Assistant Examiner* — Sean Luck
(74) *Attorney, Agent, or Firm* — McDermott Will & Emery LLP

(57) ABSTRACT

An object of the invention is to provide a scanning electron microscope which forms an electric field to lift up, highly efficiently, electrons discharged from a hole bottom or the like even if a sample surface is an electrically conductive material. To achieve the above object, according to the invention, a scanning electron microscope including a deflector which deflects a scanning position of an electron beam, and a sample stage for loading a sample thereon, is proposed. The scanning electron microscope includes a control device which controls the deflector or the sample stage in such a way that before scanning a beam on a measurement target pattern, a lower layer pattern situated in a lower layer of the measurement target pattern undergoes beam irradiation on another pattern situated in the lower layer.

10 Claims, 12 Drawing Sheets

(52) U.S. Cl.
CPC .............. *H01J 2237/0492* (2013.01); *H01J 2237/24495* (2013.01); *H01J 2237/281* (2013.01); *H01J 2237/2815* (2013.01); *H01J 2237/2817* (2013.01)

(56) References Cited

U.S. PATENT DOCUMENTS

| | | | | |
|---|---|---|---|---|
| 5,412,209 | A * | 5/1995 | Otaka et al. | 850/9 |
| 6,768,324 | B1 * | 7/2004 | Yamada et al. | 324/754.22 |
| 2009/0001279 | A1 * | 1/2009 | Kobaru | 250/396 R |
| 2011/0155905 | A1 * | 6/2011 | Hatakeyama et al. | 250/307 |

FOREIGN PATENT DOCUMENTS

| | | |
|---|---|---|
| JP | 05-259240 A | 10/1993 |
| JP | 2005-345272 A | 12/2005 |
| JP | 2008-004376 A | 1/2008 |
| JP | 2010-118414 A | 5/2010 |
| JP | 2010-175249 A | 8/2010 |

* cited by examiner

ENERGY DISTRIBUTION OF DETECTED ELECTRONS

SCANNING ELECTRON MICROSCOPE

RELATED APPLICATIONS

This application is the U.S. National Phase under 35 U.S.C. §371 of International Application No. PCT/JP2013/053790 filed on Feb. 18, 2013, which in turn claims the benefit of Japanese Application No. 2012-072710, filed on Mar. 28, 2012, the disclosures of which are incorporated by reference herein.

TECHNICAL FIELD

The present invention relates to a scanning electron microscope and particularly to a scanning electron microscope in which electrical charge is attached to a sample to form a signal waveform or image.

BACKGROUND ART

In measurements and inspections of a semiconductor device using a scanning electron microscope (SEM), an electron beam is cast on a sample and therefore electrical charge is formed on the device surface. In some cases, electrical charge may be a factor that causes a distortion and contrast abnormality or the like of an image.

PTL 1 proposes a method in which an electron beam is cast on a contact hole to measure an absorption current value flowing through a substrate, thus observing the hole shape.

Also, PTL 2 proposes a method in which electric potential distribution on a sample surface is made uniform by electron beam irradiation, thus aiming to improve reproducibility of an image. For example, it is disclosed that when a sample is irradiated with energy of 1500 eV, a length measurement error of 6 nm is generated by a potential difference of 10 V. Therefore, a method is proposed in which the electric potential on the surface is made constant by a charge control electrode installed on the sample.

PTL 3 and PTL 4 propose methods aiming to alleviate or stabilize electrical charge that is formed when an insulating sample is observed with the use of a SEM. In PTL 3, the electric field intensity on a sample surface or the primary electron beam scanning method at the time of acquiring an image is controlled, thereby alleviating or stabilizing the electrical charge generated by irradiation with the primary electron beam, and thus making it less susceptible to the influence of the dynamic electrical charge generated by irradiation with the primary electron beam. Moreover, in PTL 4, when inspecting the shape of a substrate surface or measuring the length with the use of a SEM, the signal waveform of a back scattered electron corresponding to the number of times of electron beam scanning until the electrical charge on the substrate reaches an equilibrium is measured, thus identifying the edge of the substance in the scanned area. Alternatively, it is proposed that the signal waveform of a back scattered electron corresponding to the number of times of electron beam scanning until the electrical charge on the substrate reaches an equilibrium is measured and compared with the signal waveform of the back scattered electron corresponding to the number of times of scanning of a known substance, thus identifying the unknown substance in the scanned area.

While the methods for restraining electrical charge are proposed as described above, an observation method utilizing electrical charge is also proposed. With the miniaturization of patterns of semiconductor devices, integration to stack up in vertical direction is being advanced. As structures are stacked up, devices having high aspect ratios (pattern height/hole diameter or groove width) such as a deep hole or deep groove are emerging. For inspections of these patterns, dimensional management of the hole bottom and the groove bottom is required as well as dimensional management of the surface.

In observation of a sample with a high aspect ratio, since the amount of secondary electrons detected from the pattern bottom is small, contrast is not generally achieved and observation and measurement is difficult. Therefore, observation utilizing electrical charge is used. In the case of a material (insulator) that is electrically charged on the surface, positive electrical charge is formed on the sample surface by precharging (pre-dosing) of the surface at a low magnification before observation. After that, observation at a high magnification is carried out, and observation is thus carried out by lifting up the secondary electrons on the hole bottom with the positive electrical charge on the surface.

PTL 5 proposes a method in which dimensional measurement at an arbitrary depth is carried out, based on the amount of positive electrical charge formed on the surface. It is considered that the depth where lifting of secondary electrons is possible can be controlled by adjusting the amount of electrical charge on the surface.

CITATION LIST

Patent Literature

PTL 1: JP-A-2010-118414
PTL 2: JP-A-2008-4376
PTL 3: JP-A-2005-345272
PTL 4: JP-A-5-29424
PTL 5: JP-A-2010-175249

SUMMARY OF INVENTION

Technical Problem

In the case of inspecting the dimension of a deep hole or deep groove, the pre-dosing method in which positive electrical charge is attached to the sample surface, thereby forming an electric field to lift up electrons between the hole bottom or the like and the sample surface, as described above, is a very effective technique. However, if the sample surface is an amount of electrically conductive material, electrical charge cannot be formed. In each of the techniques of the above PTLs, in the case where the sample surface is an amount of electrically conductive material, an electric field to lift up electrons discharged from the hole bottom cannot be formed. A scanning electron microscope with an objective of forming an electric field to lift up, highly efficiently, electrons discharged from the hole bottom or the like even if the sample surface is an electrically conductive material will be described hereinafter.

Solution to Problem

As an embodiment to achieve the above objective, a scanning electron microscope is proposed, the scanning electron microscope including an electron source, an objective lens which condenses an electron beam discharged from the electron source, a deflector which deflects a scanning position of the electron beam, and a sample stage for loading a sample thereon, and the scanning electron microscope including a control device which controls the deflector or the sample stage in such away that before scanning a beam on a measurement target pattern, a lower layer pattern situated in a lower layer of the measurement target pattern undergoes beam irradiation on another pattern situated in the lower layer.

Advantageous Effect of Invention

According to the above configuration, it is possible to guide, highly efficiently, electrons discharged from the hole bottom or deep groove or the like even if the sample surface is an electrically conductive material.

DESCRIPTION OF EMBODIMENTS

In observation of a pattern having a high aspect ratio (depth/pattern width) such as a deep hole or deep groove using a SEM, electrons discharged from the hole bottom collide with the sidewall of the deep hole, and the contrast of the hole bottom decreases significantly. Therefore, a technique of positively charging the sample surface to form a potential difference (electric field) between the surface and pattern bottom and thus lifting up electrons discharged from the pattern bottom is effective. This method is effective only in the case of a sample that is electrically charged on the surface.

For example, in a pattern having a surface that is a conductor, positive electric charge cannot be formed on the surface and an electron lifting electric field cannot be formed in the pattern.

Thus, in an example described below, a technique is proposed in which, for example, in the case where the pattern bottom is a floating electrode, an electron beam is cast in advance only on the pattern bottom to negatively charge the pattern bottom (local precharging), thus forming a lifting electric field between the pattern bottom and the surface. To avoid the influence of a potential barrier generated by the negative charging of the sidewall with the local precharging, observation is carried out at a different site from the site where the local precharging is carried out (but, a site where the floating electrode at the pattern bottom is connected). Since there is a potential difference between the surface and the pattern bottom, detected secondary electrons are discriminated by energy, and signals on the surface and the pattern bottom are separated and enhanced.

Figure 12:
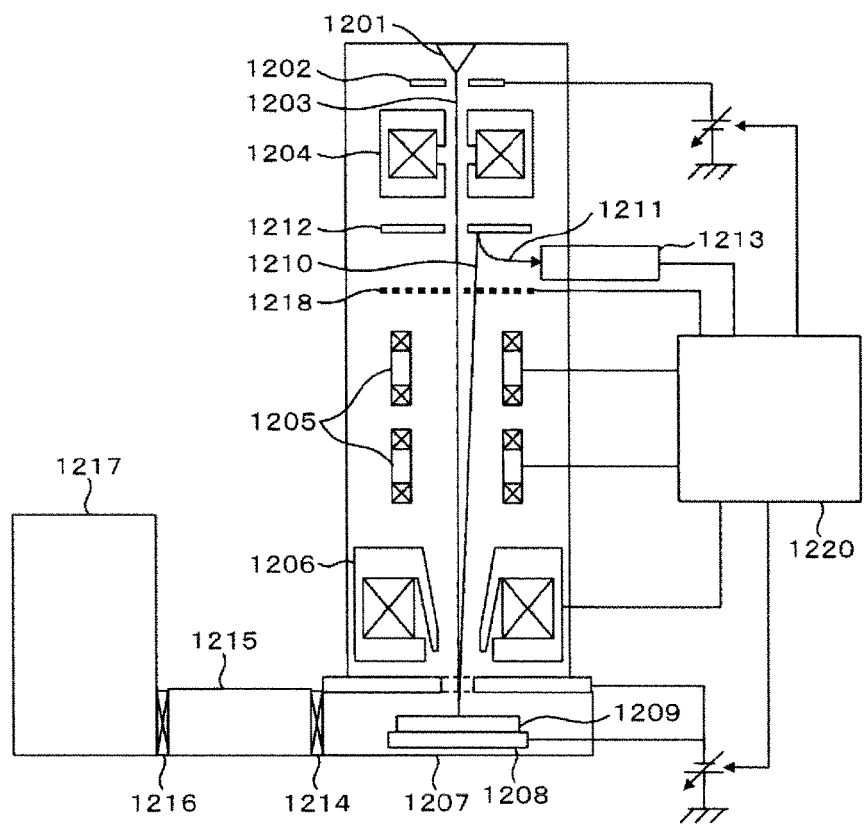
FIG. 12 is a view showing an outline of a scanning electron microscope.

FIG. 12 is a view showing an example of a scanning electron microscope which carries out beam irradiation for pre-charge as described above and measurement of a pattern based on a signal waveform. An electron beam 1203 that is extracted from an electron source 1201 by an extraction electrode 1202 and accelerated by an acceleration electrode, not shown, is condensed by a condenser lens 1204 as a form of condensing lens and subsequently allowed to scan one-dimensionally or two-dimensionally on a sample 1209 by a scanning deflector 1205. The electron beam 1203 is decelerated by a negative voltage applied to an electrode provided inside a sample stage 1208, and is condensed by the lens effect of an objective lens 1206 and cast on the sample 1209.

As the electron beam 1203 is cast on the sample 1209, secondary electrons and electrons 1210 like back scattered electrons are discharged from the irradiated part. The discharged electrons 1210 are accelerated in the direction of the electron source by an acceleration effect based on a negative voltage applied to the sample, then collide with a conversion electrode 1212, and generate secondary electrons 1211. The secondary electrons 1211 discharged from the conversion electrode 1212 are captured by a detector 1213, and the output from the detector 1213 changes depending on the amount of captured secondary electrons. The luminance of a display device, not shown, changes according to this output. For example, in the case of forming a two-dimensional image, a deflection signal to the scanning deflector 1205 and the output from the detector 1213 are synchronized, thus forming an image in a scanning area. Also, the scanning deflector 1205 may be supplied with a deflection signal for shifting the field of view, additionally superimposed on a deflection signal for carrying out two-dimensional scanning within the field of view. The deflection based on this deflection signal is also called image shift deflection, which enables a shift of the position of the field of view of an electron microscope without moving a sample by a sample stage or the like. In this example, an example where a common deflector carries out image shift deflection and scanning deflection is described. However, a deflector for image shift and a deflector for scanning may be provided separately.

Also, an energy filter 1218 for discriminating the energy of the electrons discharged from the sample is installed between the sample 1209 and the conversion electrode 1212. The energy filter is formed of, for example, three mesh electrodes and forms an electric field configured to reflect electrons heading toward the conversion electrode 1212 from the sample 1209. By adjusting the voltage applied to the mesh electrodes, the energy of electrons that can pass through the energy filter can be adjusted.

It should be noted that while the example of FIG. 12 describes an example where electrons discharged from the sample are converted at an end at the conversion electrode and then detected, as a matter of course, such a configuration is not limiting, and it is also possible to employ, for example, a configuration in which an electron multiplier or the detection surface of the detector is arranged on the trajectory of accelerated electrons.

A control device 1220 controls each configuration of the scanning electron microscope and also has the function of forming an image based on the detected electrons and the function of measuring the pattern width of a pattern formed on the sample, based on the intensity distribution of the detected electrons called a line profile. Also, in the scanning electron microscope illustrated in FIG. 12, a preliminary exhaust chamber 1215 which carries out preliminary exhaustion of the sample atmosphere when the sample is introduced into a sample chamber 1207, and a mini-environment 1217 forming an air purifying space are installed. Moreover, vacuum valves 1214, 1216 for vacuum sealing are provided between these spaces.

Figure 13:
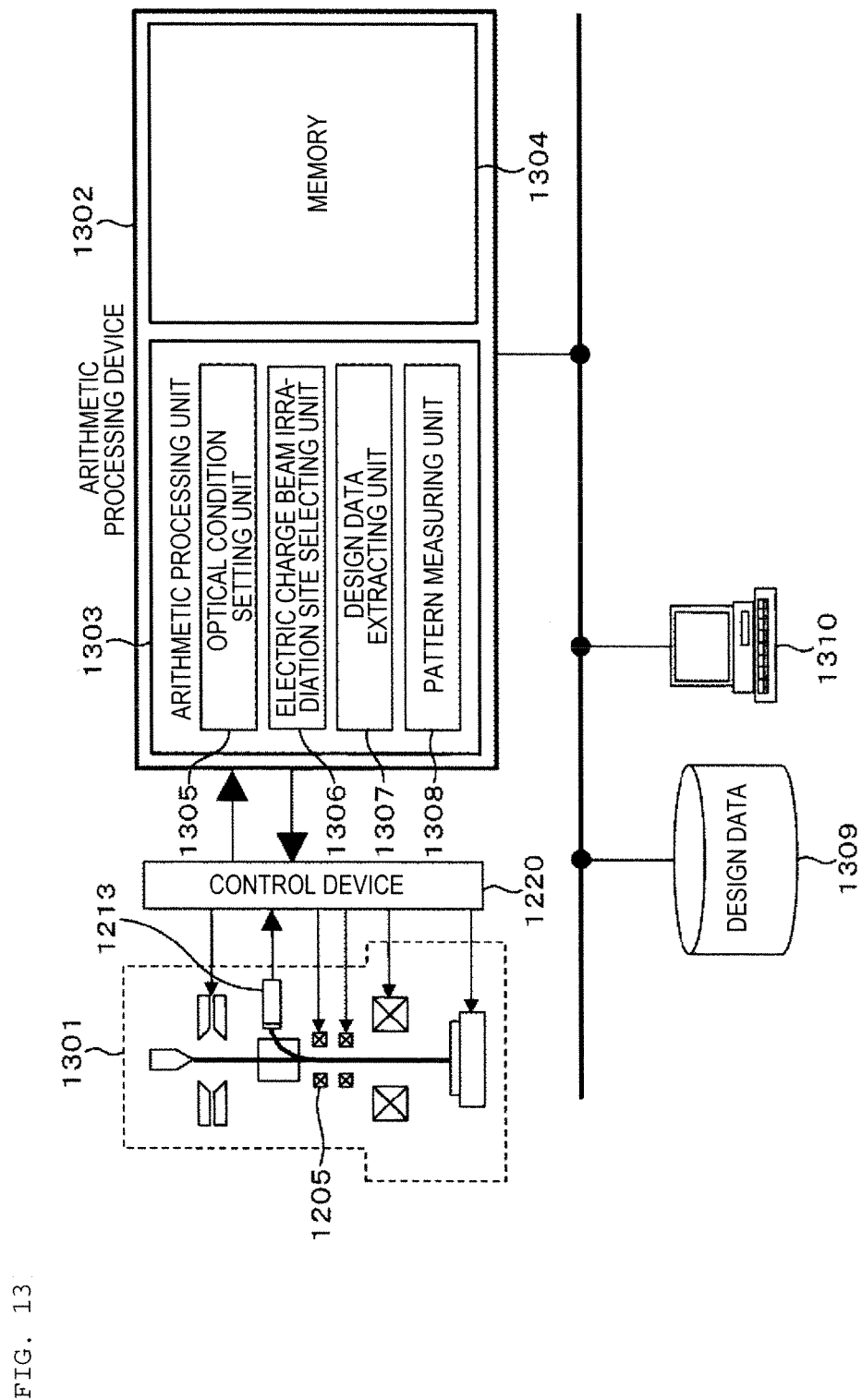
FIG. 13 is a view showing an example of a semiconductor measurement system including a scanning electron microscope.

FIG. 13 is a detailed explanatory view of a measurement or inspection system including the SEM. This system may include a scanning electron microscope comprised of a SEM main body 1301, the control device 1220 of the SEM main body, and an arithmetic processing device 1302. Inside the arithmetic processing device 1302, an arithmetic processing unit 1303 which supplies a predetermined control signal to the control device 1220 and executes signal processing of a signal obtained at the SEM main body 1301, and a memory 1304 which stores acquired image information and recipe information are provided. It should be noted that while the control device 1220 and the arithmetic processing device 1302 are described as separate devices in this example, these devices may be an integrated control device.

Electrons discharged from the sample, or electrons generated at the conversion electrode are captured by the detector 1213 and converted to a digital signal by an A/D converter provided within the control device 1220. Image processing according to the purpose is carried out by image processing hardware such as CPU, ASIC, or FPGA provided inside the arithmetic processing device 1302.

Inside the arithmetic processing unit 1303, an optical condition setting unit 1305 which sets an optical condition of the SEM based on a measurement condition or the like inputted by an input device 1310, and an electric charge beam irradiation site selecting unit 1306 which selects an electric charge beam irradiation area (or position), described later, are provided. Also, in the arithmetic processing unit 1303, a design data extracting unit 1307 is provided which reads out design data from a design data storage medium 1309 according to the condition inputted by the input device 1310 and converts the design data from vector data to layout data according to need. Also, a pattern measuring unit 1308 which measures the dimension of a pattern based on an acquired signal waveform is provided inside. The pattern measuring unit 1308 forms a line profile, for example, based on a detection signal, and executes dimension measurement between peaks in the profile.

It should be noted that change in the beam irradiation position or the scanning position is executed by controlling a drive signal to the sample stage 1208 or a supply signal to the deflector 1205.

Moreover, on a display device provided on the input device 1310 connected to the arithmetic processing device 1302 via a network, a GUI which shows an image, inspection result or the like to the operator is displayed.

It should be noted that a part or all of the control and processing in the arithmetic processing device 1302 can be allocated to a CPU or an electronic computer or the like equipped with a memory capable of storing images, and thus processed and controlled. Also, the control device 1220 and the arithmetic processing device 1302 may be configured as a single arithmetic device. Moreover, the input device 1310 also functions as an image pickup recipe producing device which sets measurement conditions including the coordinates of an electronic device, type of pattern, and image pickup conditions (optical conditions and stage movement conditions) that are considered necessary for inspection or the like, as an image pickup recipe. Also, the input device 1310 has the function of collating the inputted coordinate information and information about the type of pattern, with layer information of the design data and the identification information of the pattern, and reading out necessary information from the design data storage medium 1309.

The design data stored in the design data storage medium 1309 is expressed in the GDS format or OASIS format and stored in a predetermined form. Also, the design data may be any type, as long as the format thereof can be displayed by software that displays the design data and the design data can be handled as graphical data. Also, the design data may be line-segment image information on which deformation processing to achieve a pattern that is closer to a real pattern is carried out by implementation of a light exposure simulation, instead of line-segment image information representing an ideal shape of the pattern formed on the basis of the design data.

Example 1

Figure 1:
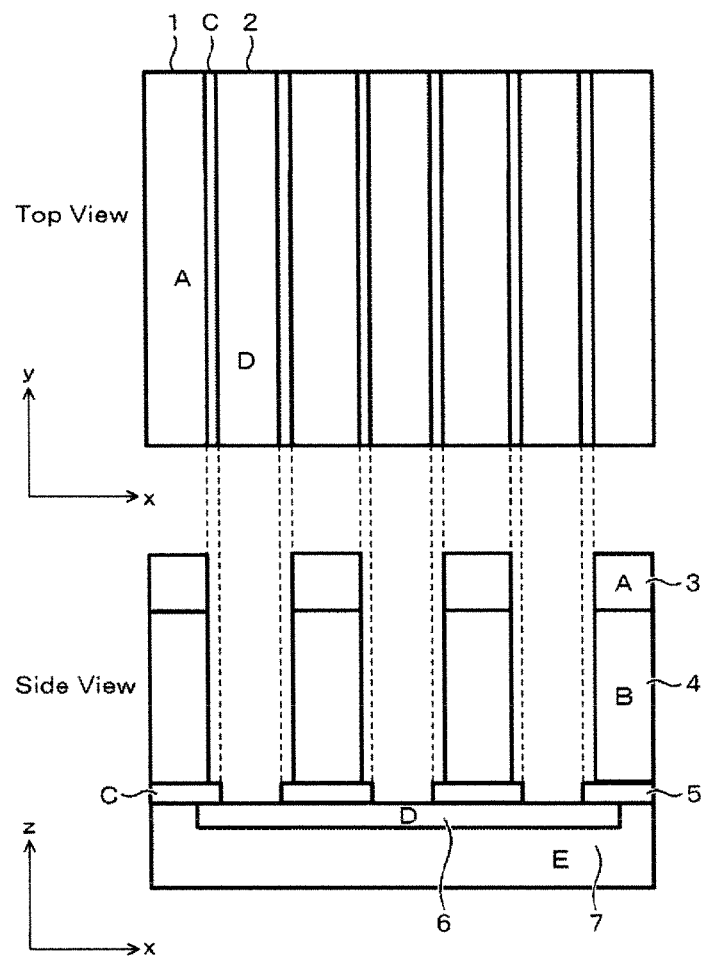
FIG. 1 is a view showing an example of a deep groove structure that is a measurement target of a scanning electron microscope.
Figure 2:
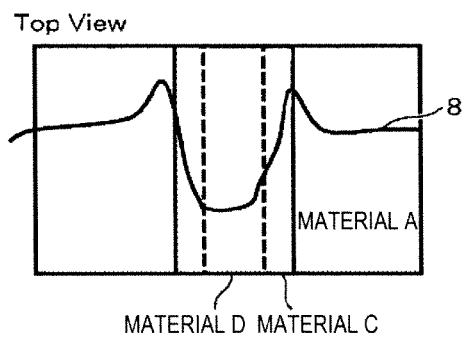
FIG. 2 is a view showing an example of a SEM image and line profile obtained when a sample is beam-scanned.

A specific technique for measuring pattern based on irradiation with a pre-charge beam will be described hereinafter. FIG. 1 is a top view and a side view of a deep groove pattern formed of five types of materials. In FIG. 1, a material A is a conductor, materials B, C and E are insulators, and a material D is a conductor (floating electrode). An image that is obtained when normal scanning and observation is carried out is shown in FIG. 2. As can be seen in the waveform signal (line profile), since the amount of detected signals in the groove bottom is small, there is little contrast between the material C and the material D and it is difficult to determine the boundary. In this deep groove pattern, since the top part of the pattern is a conductor, positive electric charge cannot be formed on the surface by low-magnification irradiation. Therefore, it is difficult to lift up electrons at the groove bottom by a pre-dosing method that is simply for pre-charge.

In this example, in order to achieve clear contrast even with a sample where plural materials coexist at the bottom part, an example will be described in which before a beam is allowed to scan on a measurement target pattern, the field of view (FOV) is moved so that a lower layer pattern situated in a lower layer of the measurement target pattern undergoes beam irradiation on another pattern situated in the lower layer, thus casting a beam for pre-charge at a different position from the measurement target pattern. Hereinafter, an example in which an electron beam is locally cast (hereinafter referred to as local precharging) to negatively charge the groove bottom will be described.

Figure 3:
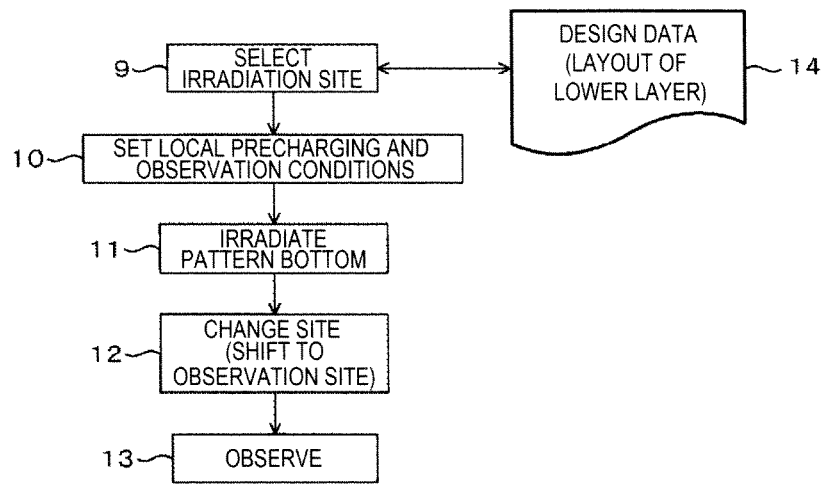
FIG. 3 is a flowchart showing a process of pre-charge formation and SEM image formation based on electron beam irradiation.
Figure 4:
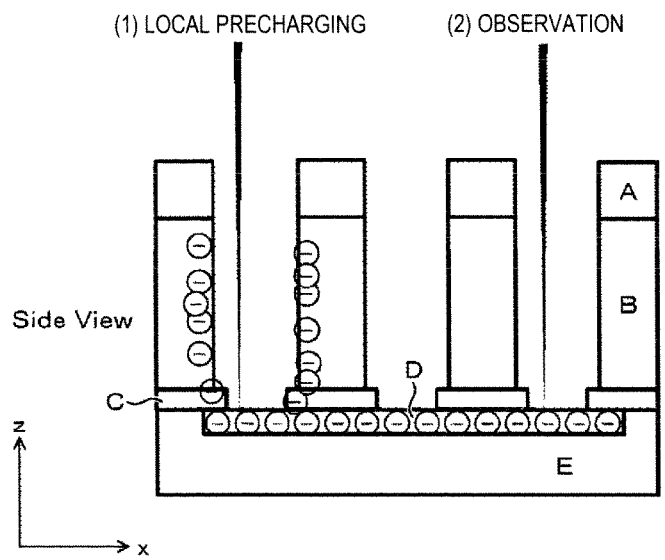
FIG. 4 is a view showing the relation between the electron beam irradiation position for pre-charge formation and the beam irradiation position for SEM image formation.

FIG. 3 is a flowchart showing a SEM observation process including a pre-charge beam irradiation process. First, in selecting a site where local precharging is to be carried out, a site where an observation site and the groove bottom are connected together is selected (Step 9). Also, local precharging conditions and observation conditions are set (Step 10). Here, as a reason for discriminating between the observation site and the local precharging site, electric charge in the groove due to local precharging may be mentioned. FIG. 4 shows electric charge distributions in the groove at the time of local precharging and at the time of observation. As local precharging is carried out, secondary electrons discharged from the groove bottom adhere, accumulating negative electric charge on the sidewall of the groove. The negative electric charge on the sidewall of the groove forms a barrier potential to the second electrons generated at the groove bottom (pushing back into the direction of the groove bottom). Therefore, if observation is carried out in the same groove as the local precharging, the effect of the local precharging is eliminated. Therefore, it is necessary to carryout local precharging and observation at different sites where the material D of the groove bottom is connected. By local precharging on the groove bottom, the material D that is a floating electrode is negatively charged (Step 11). Thus, an electric field in the direction of the groove bottom from the surface is formed in the groove at the observation site. After that, shifting to the observation site where the material D is connected (Step 12), and observation is carried out at a preset magnification (Step 13). By the electric field formed by the negative electric charge at the groove bottom, the secondary electrons discharged from the groove bottom are lifted up and the contrast at the groove bottom increases.

In this example, since local precharging is carried out at a different site from observation, the bottom of the groove is negatively charged in relation to the surface, thus increasing the number of secondary electrons detected from the groove bottom.

Figure 5:
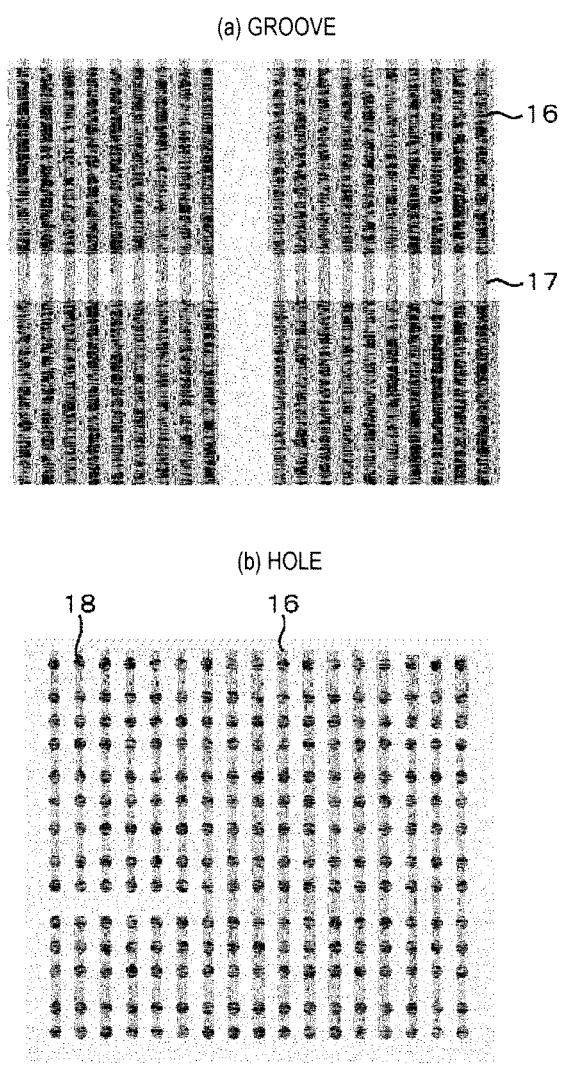
FIG. 5 is a view showing superimposed layout data in which layout data of an upper layer pattern and layout data of a lower layer pattern are superimposed together.

Next, a method for designating the site where local precharging is carried out will be described. As described above, in order to negatively charge the groove bottom of the observation site, the site where the material D in the lower layer and the observation site are connected together needs to be irradiated. Therefore, the layout pattern in the lower layer of the device and an observation image acquired at a low magnification are superimposed, thus deciding the irradiation site. FIG. 5 shows an example in which an observation image acquired at a low magnification of lines and spaces and hole patterns is superimposed on the layout pattern in the lower layer of the device. By providing a GUI which simultaneously displays the layout in the lower layer and the actual observation image, the site connected to the observation site can be confirmed and a precharging site can be set.

The designation of a precharging site is arbitrarily set by operator using a cursor box. As the setting of conditions for local precharging, an irradiation range, an irradiation time, and an amount of irradiation current are designated. When the relation between the amount of irradiation current and the amount of accumulated electric charge (negative charge potential) is found in advance, if a necessary electric potential is designated, either the irradiation time or the amount of irradiation current is decided automatically as a parameter.

Figure 6:
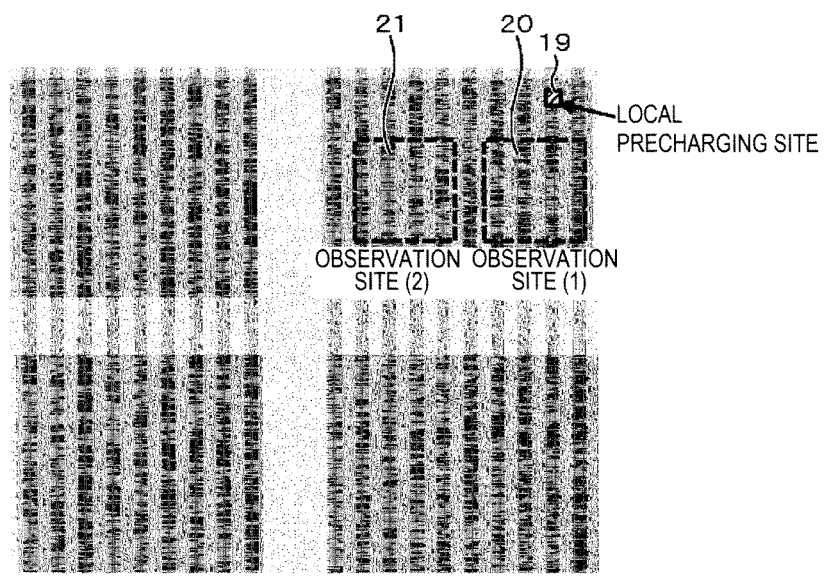
FIG. 6 is a view showing the positional relation between the irradiation position of a beam for pre-charge and a SEM image acquisition area.

As the setting of observation conditions, an observation site, an observation magnification, am amount of irradiation current, and a number of frames are designated. The observation site is designated on the GUI screen using the cursor box, as in the case of the precharging. Also, if the area of the material D, which is the lower layer pattern, is broad, plural sites can be observed in one round of local precharging, as shown in FIG. 6, and the frequency of implementation of local precharging can be reduced. The frequencies of local precharging and observation can also be designated in combination by the operator. The contents of these settings are saved in the internal memory of the device or on the hard disk, and can be reused in another measurement. After the conditions are set, the recipe is executed, thus automatically executing precharging and observation.

The enhancement of the pattern bottom signal according to this example is not limited to a deep groove and can also be applied to a deep hole, via-shape or the like, as long as the bottom of the pattern is a floating electrode.

Figure 14:
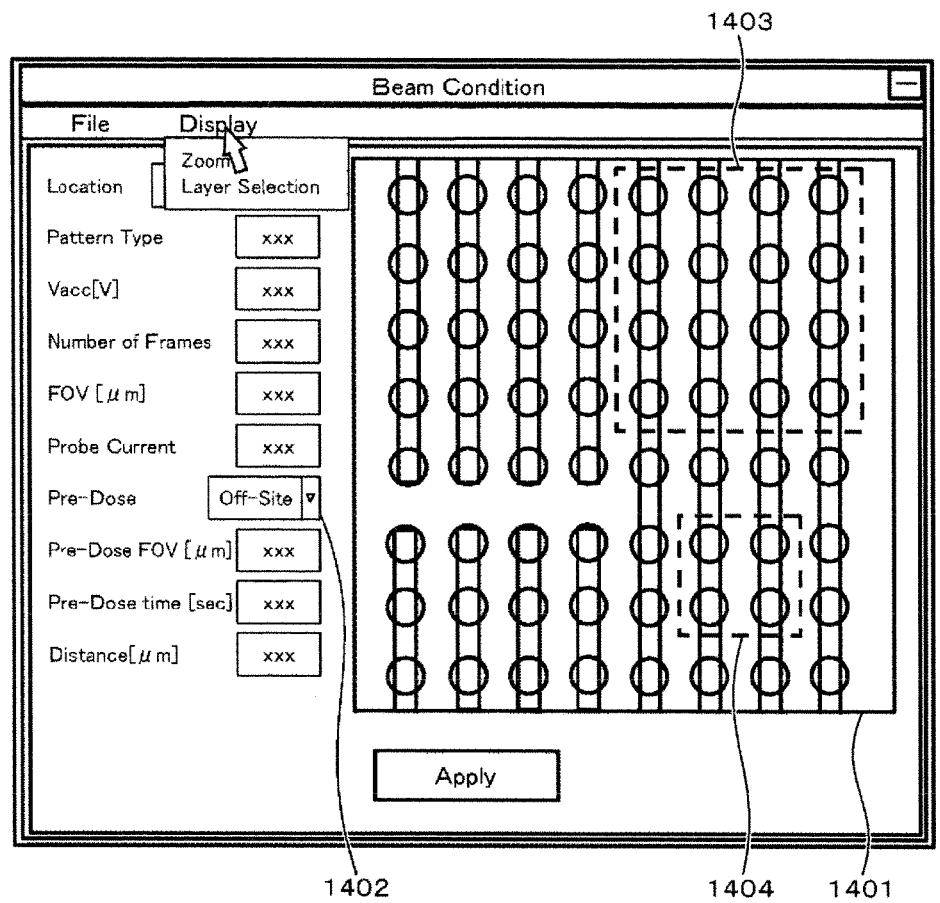
FIG. 14 is a view showing an example of a GUI (graphical user interface) for setting a SEM image forming area and a pre-charge irradiation area.

FIG. 14 is a view showing an example of a GUI screen for setting observation conditions (acquisition conditions of measurement image) and pre-charge conditions, on layout data created on the basis of design data. This GUI screen is displayed, for example on the display screen of the input device 1310. In the GUI screen illustrated in FIG. 14, a display area 1401 for displaying layout data and a setting window for setting beam irradiation conditions are provided. In the setting window, a window for setting beam conditions for observation and a window for setting beam conditions for electric charge formation are provided. Also, it should be made possible to set other parameters according to need, and other windows may also be provided.

As an observation beam setting window, there is, for example, a position information setting window for setting the position of measurement or of the field of view (Location), a setting window for setting a type of pattern (Pattern Type), a setting window for setting an acceleration voltage of the beam (Vacc: Acceleration Voltage), a cumulative number of frames (Number of Frames), a size of the field of view (FOV), or a beam current (Probe Current). The layout data displayed in the display area 1401 may be read out from the design data storage medium 1309, for example, based on the setting of the position of measurement or the position of the field of view. In this case, part of the design data is read out and that part is converted into layout data and displayed on the display screen, according to the coordinate information of the position of measurement or the position of the field of view and the size of the field of view that is set. Also, since the identification information of the pattern and layer is stored in the design data, the design data may be read out, based on the selection of the identification information of the pattern and layer and the coordination information or the like.

Figure 15:
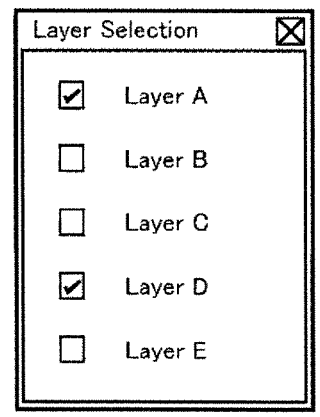
FIG. 15 is a view showing a layer selection window displayed on a GUI screen.

For example, if the position information and the size of the field of view are selected in the GUI screen illustrated in FIG. 14, layout data corresponding to the designated area is read out and displayed on the display device. Moreover, a layer to be displayed in the display area 1401 may be selected, using a layer selection window as illustrated in FIG. 15. Since identification information is added to each layer, as described above, selective display of a desired layer is enabled by referring to this identification information.

Also, the electric charge formation beam condition setting window 1402 is a window for deciding on the type of beam irradiation condition. In this window, for example, not to carry out precharging (Off), to carry out precharging in the state where the field of view for observation and the field of view for pre-charge match (On-Site), and to carry out precharging where the field of view for observation and the field of view for precharging are spaced apart (Off-Site) or the like can be set. In addition, windows for setting a size of precharging area (Pre-Dose FOV), a precharging time (Pre-Dose time) and a distance between an observation area 1403 and a pre-charge beam irradiation area 1404 (Distance) are provided. It should be noted that while the pre-charge beam irradiation area 1404 has a predetermined size in the example of FIG. 14, this is not limiting and a spot-like beam may be selectively cast on a deep hole or deep groove.

Figure 16:
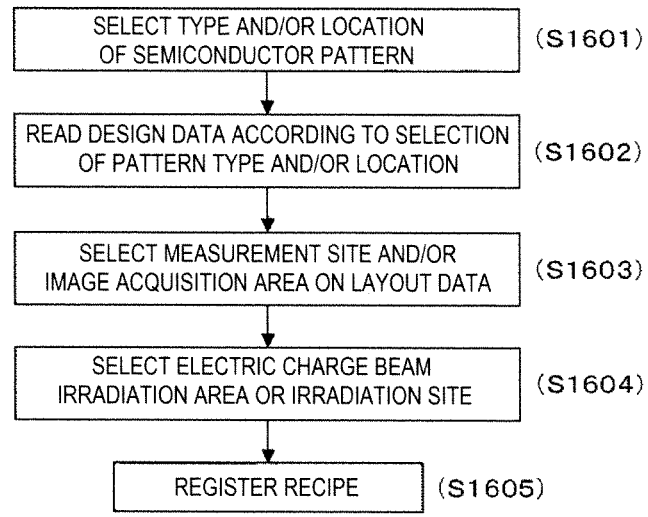
FIG. 16 is a flowchart showing a process of deciding of a beam for electric charge, based on selection of a measurement target pattern.

FIG. 16 is a flowchart showing a process of automatically deciding an irradiation area or irradiation position of a pre-charge beam, based on the selection of the type and location (position information such as coordinates) of a pattern as a measurement target. First, on the GUI screen displayed on the display device of the input device 1310, a type and location of a pattern as a measurement target is selected (Step 1601). Based on the information of the pattern type and location selected on the basis of the selection, the design data extracting unit 1307 reads out design data from the design data storage medium 1309 and converts the design data into layout data (Step 1602). Since identification information is added to the pattern and layer in the design data, as described above, the layout data of a desired pattern or a pattern belonging to the area is read out, referring to the information. Next, a desired measurement site or image acquisition area is selected on the GUI screen (Step 1603).

The electric charge beam irradiation site selecting unit 1306 selects an electric charge beam irradiation site or the like, according to the selected measurement site or image acquisition area (Step 1604). Here, an appropriate pattern as an electric charge beam irradiation target is a pattern that is (A) another pattern (upper layer pattern) having the same measurement target pattern and lower layer wire (floating electrode), and (B) a pattern existing in an area that does not overlap with the observation beam irradiation area. With respect to the condition (A), the superimposed site of the upper layer pattern and the lower layer pattern can be specified by referring to the design data, and with respect to the condition (B), the observation beam irradiation area (field of view) can be specified by the setting in Step 1603 or the like. Therefore, by narrowing down the electric charge beam irradiation site based on the AND condition between the conditions (A) and (B), it is possible to automatically select an electric charge beam irradiation site, based on the arithmetic operation by the arithmetic processing unit 1303. If plural candidates of the electric charge beam irradiation site are extracted or there is no candidate, a message prompting further narrowing down or an error message may be generated to carry out manually assisted selection. Also, the narrowing down using other conditions than the conditions (A) and (B) may be carried out automatically. The electric charge beam irradiation conditions that are automatically selected are registered as a recipe, for example to the memory 1304 (Step 1605).

By providing the automatic selection function as described above, it is possible to properly set a pre-charge beam irradiation position.

Example 2

Figure 7:
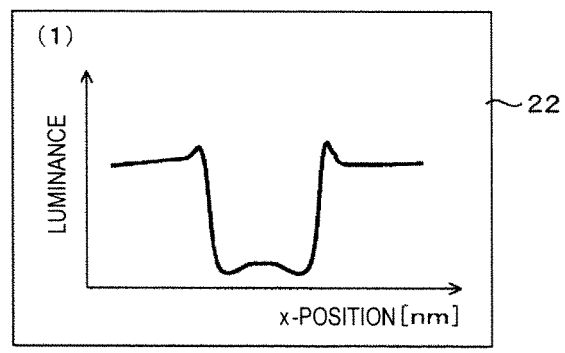
FIG. 7 is a view showing examples of signal waveforms acquired under different conditions.
Figure 7:
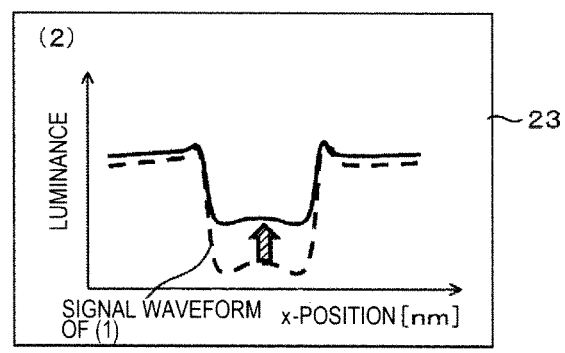
Figure 7:
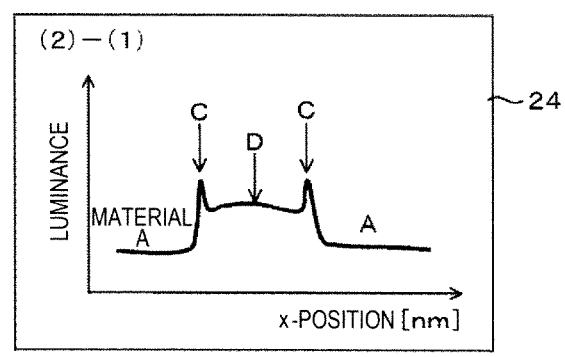

Next, a second example will be described. In observation of a sample with a high aspect ratio, it may be difficult to observe the pattern bottom because the contrast between the surface and the pattern bottom is too high. A method in which images acquired under different conditions are used in such a case, to enhance the signal of the pattern bottom, will be described. In this example, an image observed under the condition that local precharging is not carried out, and an image observed after local precharging is carried out at the groove bottom are combined, thus enhancing the signal of the hole bottom. FIG. 7 shows a signal waveform (1) observed without carrying out local precharging, and a signal waveform observed after local precharging. Since the electric charge state on the surface does not change, the signal waveform on the surface does not change. Meanwhile, in the signal waveform in the groove, the amount of signal increases in (2) because the material D is negatively charged by precharging. Here, by subtracting the signal waveform observed without precharging from the signal waveform at the time of observation after precharging, it is possible to leave only the signal at the groove bottom and enhance the signal in the groove.

Figure 17:
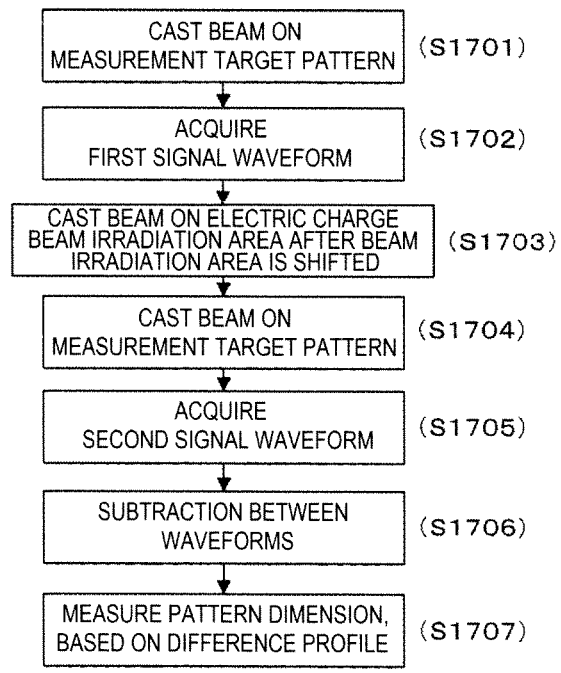
FIG. 17 is a flowchart showing a process of carrying out dimension measurement of a pattern, based on a signal waveform acquired before and after irradiation with a beam for pre-charge.

FIG. 17 is an example of a flowchart for automatically executing the measurement as described above. First, beam irradiation is carried out to a measurement target pattern and a first signal waveform 22 is acquired (Steps 1701, 1702). Next, the beam irradiation position on the sample is shifted by an image shift or a shift of the stage, and an electric charge beam is cast (Step 1703). Then, a beam is cast on the measurement target pattern again and a second signal waveform 23 is acquired (Steps 1704, 1705). The pattern measuring unit 1308 carries out subtraction between the first signal waveform 22 and the second signal waveform 23 (second signal waveform minus first signal waveform), and executes dimension measurement, using a resulting different profile 24 (Steps 1706, 1707).

By registering a recipe to automatically execute the processing as described above to the memory 1304 in advance, it is possible to automatically execute measurement and observation of the hole bottom or groove bottom.

This subtraction has not only the effect of eliminating the luminance information of the material A but also the effect of clarifying the contrast between the material C and the material D. Since the material D is selectively charged by the implementation of pre-charge beam irradiation, the luminance of the material D is improved significantly. Meanwhile, electrons discharged from the material C are slightly improved in detection efficiency due to the influence of the electric charge of the material D, but since the material C itself is not electrically charged, the improvement in detection efficiency is relatively limited. Therefore, the contrast between the material C and the material D can be increased by the selective charge of the material D, and a peak of the material C can be accentuated by the subtraction. By thus making the peak of the material C more visible, for example, it is possible to properly evaluate how well the material C is formed.

Example 3

Figure 8:
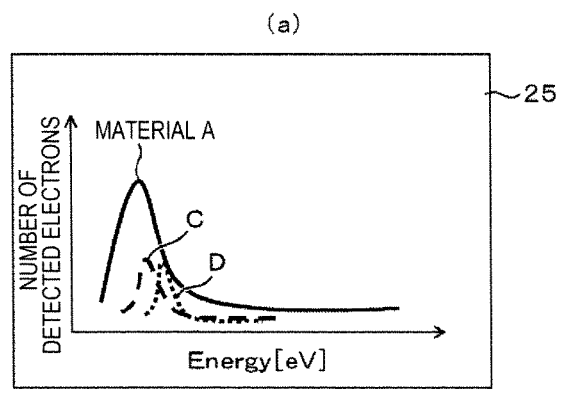
FIG. 8 is a view showing energy distributions of electrons detected when beam irradiation for pre-charge is carried out and when it is not carried out.
Figure 8:
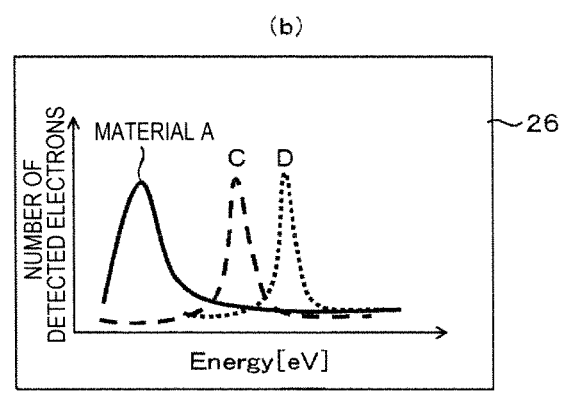

Next, a third example will be described. In this example, a method in which a pattern bottom signal is enhanced by discrimination based on the energy of detected electrons will be described. FIG. 8 shows energy distributions of electrons detected from each site when the structure of FIG. 1 is observed under the conditions with and without precharging. A signal waveform 25 (FIG. 8 (a)) is a signal waveform when precharging is not carried out. A signal waveform 26 (FIG. 8 (b)) is a signal waveform when precharging is carried out. In the case where observation is carried out under the condition without precharging, the energy distributions of detected electrons are substantially equal since there is no potential difference between the surface and the groove bottom. Also, the amount of detected signal at the groove bottom is smaller than on the surface. Meanwhile, in the case where observation is carried out after precharging, the groove bottom is negatively charged and therefore the energy distribution of detected electrons from the groove bottom is different from the distribution of detected electrons from the surface. Therefore, when observation is carried out after precharging, the signal of the groove bottom can be enhanced by discriminating detected electrons by energy.

Figure 9:
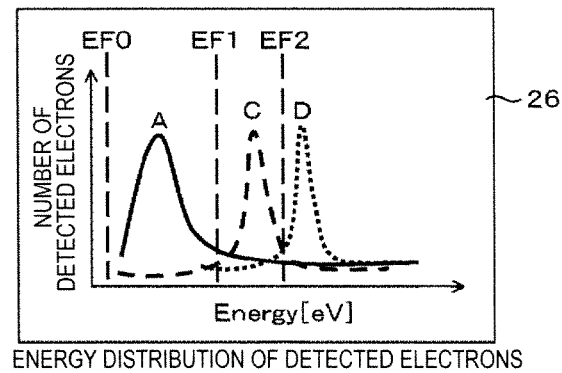
FIG. 9 is a view showing the relation between the applied voltage to an energy filter and the energy distribution of detected electrons.

FIG. 9 shows the signal waveform 26 of the energy distributions of electrons obtained by electron beam scanning after precharging. As illustrated in FIG. 9, since each material has a different energy distribution, energy distribution information having three peaks can be provided in the case of this example. Here, if electrons in an energy band (EF1-EF2) can be selectively detected, a signal waveform or image in which the contrast of the material C is enhanced can be formed. If electrons in an energy band above EF2 can be selectively detected, a signal waveform or image in which the contrast of the material C is enhanced can be formed. The energy filter is a high-pass filter which cuts low-energy electrons, and the energy of electrons that pass through the filter can be selected by proper selection of an applied voltage.

Figure 10:
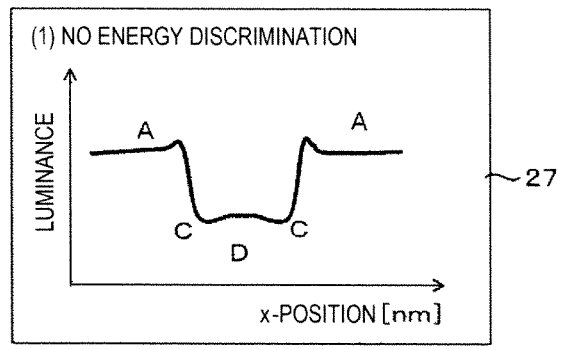
FIG. 10 is a view showing the relation between the applied voltage to an energy filter and the acquired signal waveform.
Figure 10:
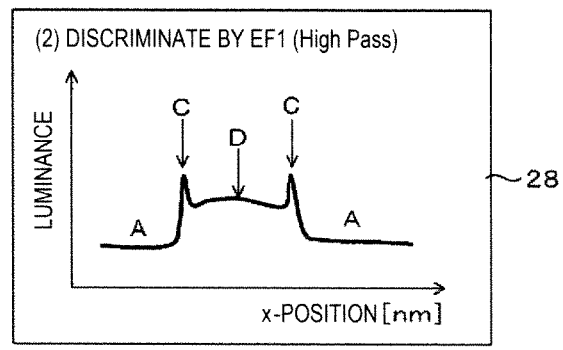
Figure 10:
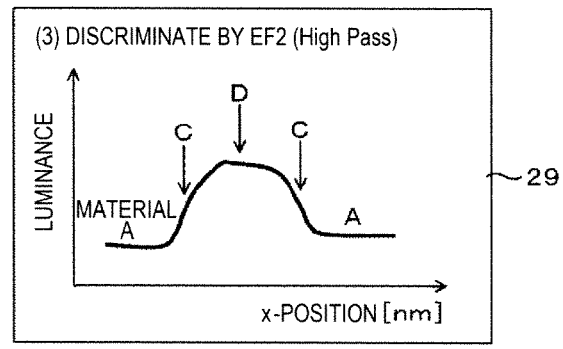

FIG. 10 is a view showing the types of waveform signals obtained by adjusting the applied voltage to the energy filter 1218. A signal waveform 27 of FIG. 10(1) is a waveform in the state where the hole bottom is dark because the amount of signals of the material A with a large number of detected electrons is large and the amount of signals at the hole bottom is small. Next, when the applied voltage to the energy filter is set to EF1, passage through the energy filter 1218, of the electrons discharged from the material A having no negative electric charge and relatively low energy, is limited and therefore the amounts of signals of the materials C and D relatively increase, as shown in a signal waveform 28 of FIG. 10(2). Thus, a signal waveform or image in which the hole bottom is bright can be formed. Moreover, when the applied voltage to the energy filter is set to EF2, passage through the energy filter 1218, of the electrons discharged from the materials A and C, is limited and therefore a signal waveform or image in which the signal of the material D is enhanced, as shown in a signal waveform 29 of FIG. 10(3), can be provided.

Figure 11:
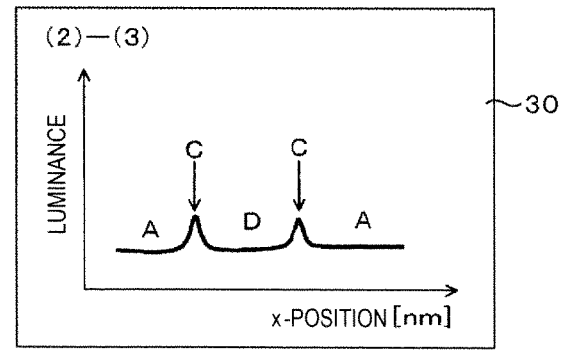
FIG. 11 is a view showing an example of a difference waveform obtained from plural signal waveforms acquired when different applied voltages are applied to an energy filter.
Figure 18:
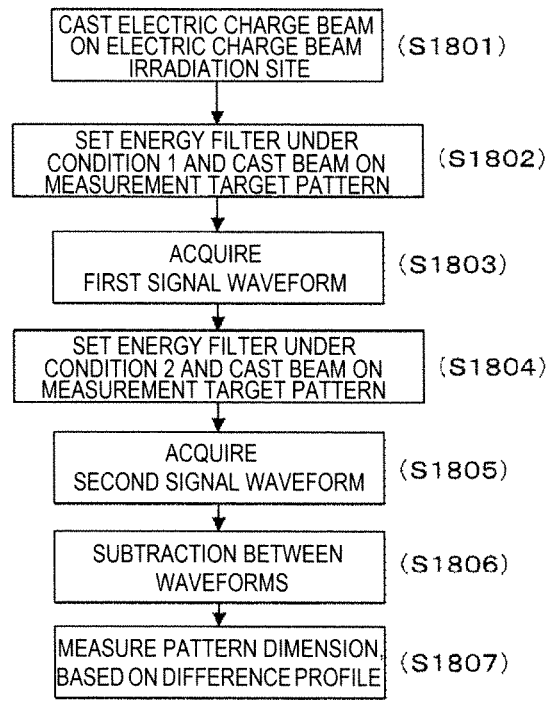
FIG. 18 is a flowchart showing a process of carrying out dimension measurement of a pattern, based on plural waveforms acquired under different energy filter conditions.

Also, by subtracting the signal waveform 29 from the signal waveform 28, information corresponding to the material D can be eliminated from the signal waveform in which the signals of the materials C and D coexist and therefore the signal of the material C can be enhanced, as illustrated in FIG. 11. FIG. 18 is a flowchart showing a process of carrying out measurement using a signal waveform in which the signal of the material C is enhanced as illustrated in FIG. 11. First, an electric charge beam is cast on an electric charge beam irradiation site (Step 1801). Next, the control device 1220 sets the applied voltage to the energy filter 1218 under the condition 1 (EF1) and casts a beam on a measurement target pattern, thus acquiring the first signal waveform (Steps 1802, 1803). Next, the applied voltage to the energy filter is set under the condition 2 (EF2) and a beam is cast on the measurement target pattern, thus acquiring the second signal waveform (Steps 1804, 1805).

The pattern measuring unit 1308 carries out subtraction between the first signal waveform 28 and the second signal waveform 29 (second signal waveform minus first signal waveform) and executes dimension measurement using a resulting difference profile 30 (Steps 1806, 1807).

By carrying out adjustment of the applied voltage to the energy filter and subtraction or the like, as described above, a signal based on electrons discharged from a desired material can be enhanced and proper signal processing can be carried out according to purpose.

Figure 19:
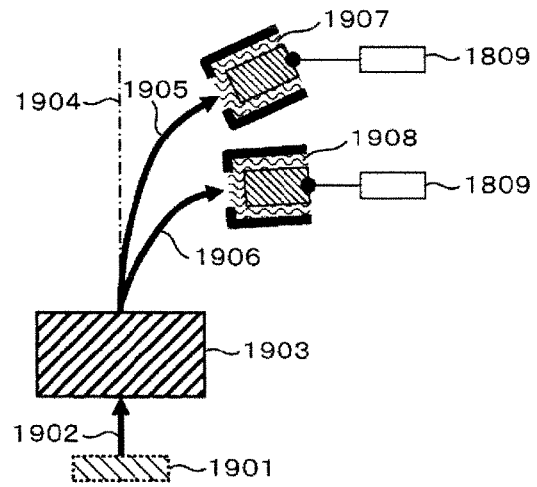
FIG. 19 is a view showing a detection optical system of a scanning electron microscope which discriminates and detects electrons of different energies, using plural detectors.

It should be noted that, while an example using a potential carrier forming unit for forming a potential barrier such as a mesh-like electrode in order to carry out energy discrimination in the above example, for example, it is possible to separate the trajectories of electrons with different energies and thereby carry out energy discrimination of electrons discharged from a sample. FIG. 19 is a view showing a device configuration to detect electrons indifferent energy bands, using detectors 1907, 1908 provided at different positions. Electrons 1902 discharged from a sample 1901 are deflected toward the detectors in such a way as to move away from an ideal optical axis 1904 of the electrons, by the deflection effect of an orthogonal electromagnetic field generator 1903. The orthogonal electromagnetic field generator 1903 is provided with a magnetic field generator so that a magnetic field orthogonal to an electric field that deflects the electrons 1902 toward the detectors is formed. This magnetic field acts to guide the electrons 1902 toward the detectors but also deflects an electron beam cast on a sample, in the opposite direction to the deflection effect of the electric field. Therefore, with proper adjustment, the electrons discharged from the sample can be selectively guided toward the detectors without deflecting the electron beam.

Also, the orthogonal electromagnetic field generator 1903 deflects electrons with weaker energy, more greatly. Therefore, energy discrimination and detection can be carried out by adjusting the orthogonal electromagnetic field generator 1903 in such a way that electrons in a first energy band (EF1-EF2) is detected using the detector 1908 on the lower side and electrons in a second energy band (≥EF2) are detected using the detector 1907 on the upper side. In this case, by combining the outputs from the two detectors after setting a proper amplification factor of amplifiers 1809, a signal in which the luminance of a desired material is selectively intensified can be formed.

As described above, enhancement processing of a signal for each material based on electrons discharged from a hole bottom or the like can be carried out by another energy discrimination detection method.

REFERENCE SIGNS LIST 1 line
2 space
3 material A
4 material B
5 material C
6 material D
7 material E
8 signal waveform 9 selection of precharging site
10 setting of precharging and observation conditions
11 irradiation on pattern bottom
12 change of site (shift to observation site)
13 observation
14 design data (layout of lower layer)
15 sidewall of groove (negative electric charge)
16 layout of lower layer (groove)
17 observation image
18 layout of lower layer with hole pattern
19 precharging area
20 observation site (1)
21 observation site (2)
22 first signal waveform (signal waveform when observed without precharging)
23 second signal waveform (signal waveform when observed after precharging)
24 difference profile (difference waveform ((2)-(1)))
25 signal waveform (energy distribution of detected electrons when observed without precharging)
26 signal waveform (energy distribution of detected electrons when observed after precharging)
27 signal waveform (signal waveform without energy discrimination)
28 signal waveform (signal waveform when energy discrimination is carried out by EF1)
29 signal waveform (signal waveform when energy discrimination is carried out by EF2)
30 difference profile (difference waveform between energy-discriminated images ((2)-(3)))

The invention claimed is:

1. A scanning electron microscope including an electron source, an objective lens which focuses an electron beam emitted from the electron source, a deflector which deflects a scanning position of the electron beam, a detector which detects electrons obtained by scanning a sample with the electron beam, and a sample stage for loading the sample thereon, the scanning electron microscope further including a control device, wherein
the control device is configured to control at least one of the deflector and the sample stage so as to position an irradiating position of the electron beam on a common floating electrode which is surrounded by an insulator and disposed in a bottom of both a measurement target pattern and a hole pattern or a groove pattern so as to irradiate the common floating electrode in the hole pattern or the groove pattern with the electron beam, and
the control device is configured to control at least one of the deflector and the sample stage so as to position the irradiating position of the electron beam on the measurement target pattern for detecting the electrons obtained by scanning an area including the measurement target pattern which is disposed at a different position from the hole pattern or the groove pattern with the detector, while a charging state of the common floating electrode by the irradiating electron beam is maintained.

2. The scanning electron microscope according to claim 1, wherein the deflector or the sample stage is controlled in such a way that the electron beam is cast on a second pattern situated at a position spaced apart from a scanning area of the measurement target pattern.

3. A pattern measurement method using a scanning electron microscope, the method comprising steps of:
charging a common floating electrode which is surrounded by an insulator, and disposed in a bottom of both a measurement target pattern and a groove pattern or a hole pattern by irradiating the common floating electrode in the groove pattern or the hole pattern with the electron beam, and
forming a signal waveform by detecting electrons obtained by scanning an area including the measurement target pattern which is formed at a different position from the groove pattern or the hole pattern with the electron beam, while a charging state of the common floating electrode based on the irradiating the electron beam is maintained.

4. The pattern measurement method according to claim 3, wherein the sample has a surface that is an electrical conductor.

5. The pattern measurement method according to claim 4, wherein an insulator is arranged between the electrical conductor and the floating electrode.

6. A scanning electron microscope including an electron source, an objective lens which focuses an electron beam emitted from the electron source, a deflector which deflects a scanning position of the electron beam, a detector which detects electrons obtained by the scanning a sample with the electron beam, and a sample stage for loading the sample thereon, the scanning electron microscope further including a control device,
wherein the control device is configured to control at least one of the deflector and the sample stage so as to position an irradiation position of the electron beam on a measurement target pattern for forming a first signal waveform based on electrons obtained by scanning an area including the measurement target pattern,
the control device is configured to control at least one of the deflector and the sample stage so as to position the irradiation position of the electron beam on a hole pattern or a groove pattern having a common underlying pattern with the measurement target pattern for irradiating the common underlying pattern with the electron beam,
the control device is configured to control at least one of the deflector and the sample stage so as to position an irradiation position of the electron beam on the measurement target pattern so as to form a second signal waveform based on electrons obtained by scanning the area including the measurement target pattern, after irradiating the common underlying pattern in the hole pattern or the groove pattern with the electron beam,
the control device is configured to calculate a differential waveform by subtracting the second signal waveform from the first signal waveform, and
the control device is configured to measure a dimension of the measurement target pattern using the differential waveform.

7. The scanning electron microscope according to claim 6, wherein at least one of the deflector and the sample stage is controlled in such a way that the beam is cast on a second pattern situated at a position spaced apart from a scanning area of the measurement target pattern.

8. A scanning electron microscope including an electron source, an objective lens which focuses an electron beam emitted from the electron source, a deflector which deflects a scanning position of the electron beam, a detector which detects electrons obtained by scanning a sample with the electron beam, a sample stage for loading the sample thereon, and an energy discriminator which carries out energy discrimination of electrons emitted from the sample, the scanning electron microscope further including a control device, wherein the control device is configured to control at least one of the deflector and the sample stage so as to position an irradiating position of the electron beam on a hole pattern or a groove pattern having a common underlying pattern with a measurement target pattern for irradiating the common underlying pattern with the electron beam, the control device is configured to control at least one of the deflector and the sample stage so as to position an irradiation position of the electron beam on a measurement target pattern so as to form a first signal waveform based on electrons obtained by scanning the area including the measurement target pattern with the electron beam under a first condition of the energy discriminator and a second signal waveform based on electrons obtained by scanning the area including the measurement target pattern with the electron beam under a second condition of the energy discriminator, after irradiating the common underlying pattern in the hole pattern or the groove pattern with the electron beam, the control device is configured to calculate a differential waveform by subtracting the first signal waveform from the second signal waveform, and the control device is configured to measure a dimension of the measurement target pattern using the differential waveform.

9. The scanning electron microscope according to claim 8, wherein the second energy band has higher energy than the first energy band, and the control device is configured to subtract the first signal waveform from the second signal waveform.

10. The scanning electron microscope according to claim 8, wherein the control device is configured to execute a dimension measurement of the pattern, using at least one of the first signal waveform, the second signal waveform, and a difference waveform obtained by subtracting the first signal waveform from the second signal waveform.

* * * * *